United States Patent [19]

Chen et al.

[11] 4,075,709
[45] Dec. 21, 1978

[54] LARGE CAPACITY BUBBLE DOMAIN MEMORY WITH REDUNDANCY

[75] Inventors: Thomas T. Chen; Isoris S. Gergis, both of Yorba Linda, Calif.

[73] Assignee: Rockwell International Corporation, El Segundo, Calif.

[21] Appl. No.: 689,313

[22] Filed: May 24, 1976

[51] Int. Cl.² .............................................. G11C 19/08
[52] U.S. Cl. .......................................... 365/2; 365/1; 365/12; 365/13; 365/15; 365/43
[58] Field of Search .................................. 340/174 TF

[56] References Cited

U.S. PATENT DOCUMENTS

| | | | |
|---|---|---|---|
| 3,703,712 | 11/1972 | Bobeck et al. | 340/174 TF |
| 3,806,901 | 4/1974 | Buhrer | 340/174 TF |
| 3,990,058 | 11/1976 | Archer et al. | 340/174 TF |
| 4,015,249 | 3/1977 | Hu et al. | 340/174 TF |

OTHER PUBLICATIONS

American Institute of Physics Conference Proceedings, Magnetism & Magnetic Materials; No. 24, 1974, pp. 641-642.

Primary Examiner—James W. Moffitt
Attorney, Agent, or Firm—H. Fredrick Hamann; G. Donald Weber, Jr.

[57] ABSTRACT

A large capacity bubble memory device using a basic storage cell design. The basic storage cell is repeated, typically in matrix form, on a suitable bubble domain structure. The cell design is arranged so that interconnecting elements between respective cells permit magnetic bubble domains to be transferred between cells. The cells include redundancy features so that the cells can be interconnected to form a large capacity storage loop.

11 Claims, 6 Drawing Figures

U.S. Patent    Feb. 21, 1978    Sheet 1 of 2    4,075,709
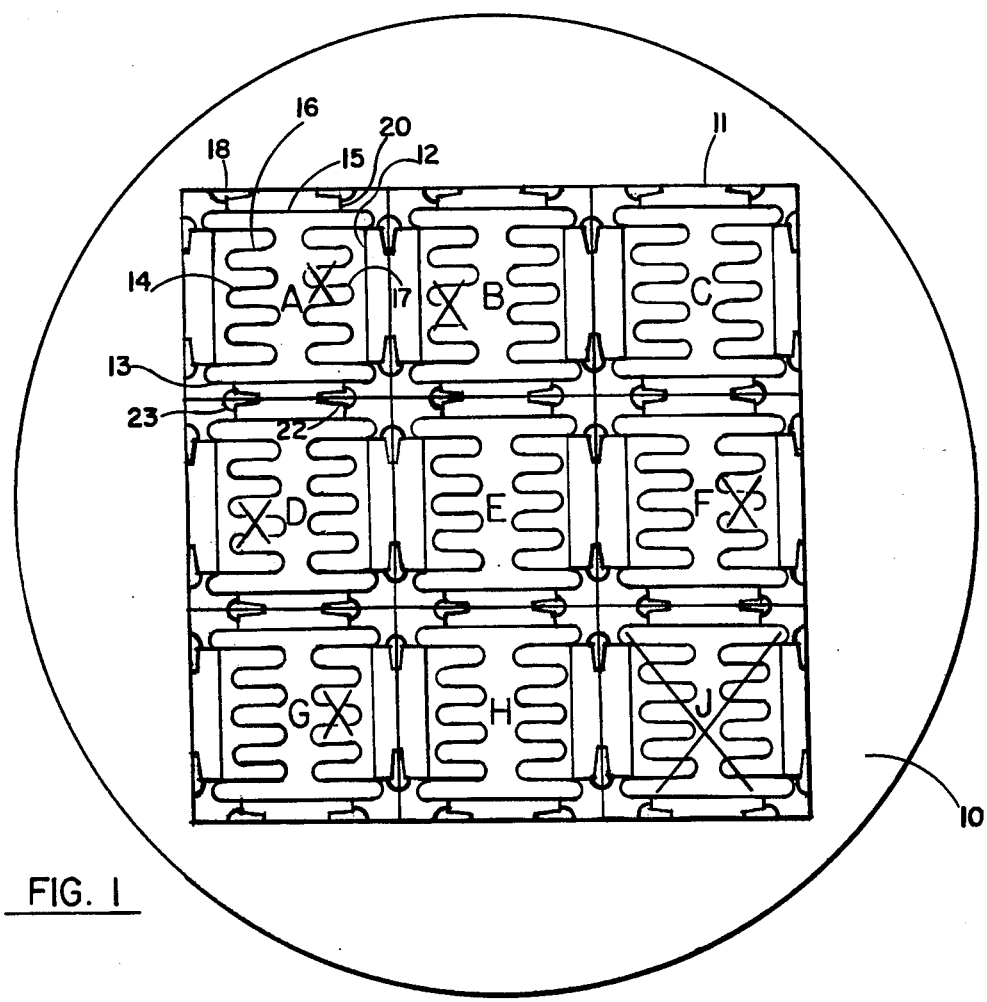
FIG. 1
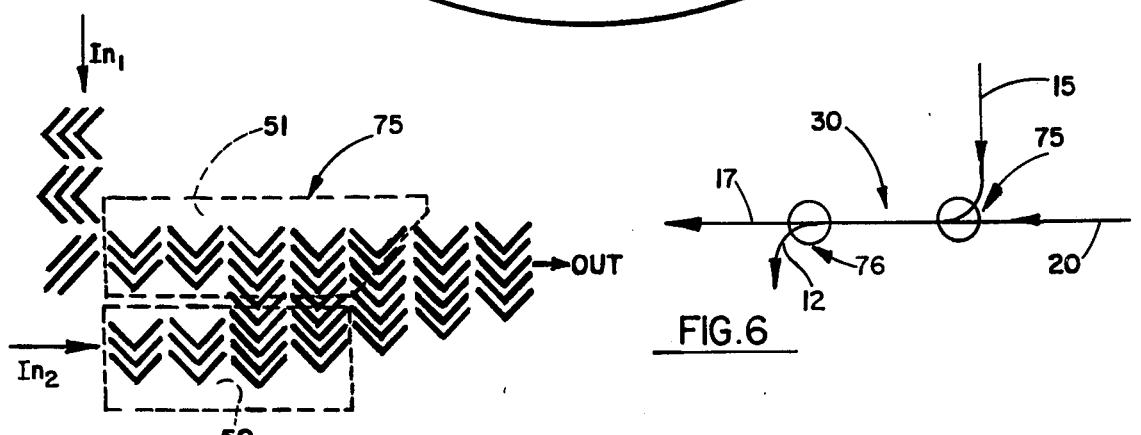
FIG. 4
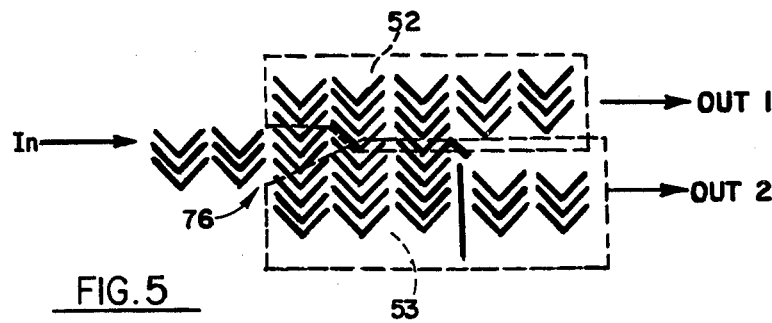
FIG. 5
FIG. 6

LARGE CAPACITY BUBBLE DOMAIN MEMORY WITH REDUNDANCY

BACKGROUND

1. Field of the Invention

This invention relates to magnetic bubble domain systems, in general, and to relatively high yield, large capacity bubble domain memories, in particular.

2. Description of Prior Art

With the introduction of magnetic bubble domain devices, many devices have been developed. As these devices have been refined and improved, the bubble domain concept has progressed beyond the curiosity stage and into the realm of commercial utilization. To improve the utilization prospects, more and better systems and systems applications are being investigated and established. Some of the systems applications include storage means such as memories.

In a mass bubble memory system, such as a bubble memory recorder, it is frequently desirable to obtain maximum storage per individual chip in order to reduce the number of chips utilized. In particular, where data storage capacity is the prime consideration and access time is of secondary importance, it is desirable to increase the total capacity of the individual memory chip so that smaller numbers of chips are required. The utilization of smaller numbers of chips permits lower packaging and electronics costs as well as better system reliability. The capacity of an individual memory chip can be increased by interconnecting, in series, a large number of memory cells. Of course, such a serial arrangement produces a relatively slow access function. A faster access time can be obtained by using a major-minor loop configuration. Such a system is described in copending application, Ser. No. 689,312; entitled LARGE CAPACITY MAJOR-MINOR LOOP BUBBLE DOMAIN MEMORY WITH REDUNDANCY, by T. T. Chen; filed on May 24, 1976; assigned to the common assignee; and incorporated herein by reference.

Presently known chip design capabilities require that the basic memory unit is a single unit which is processed photolithographically. The size of this chip is limited by the basic size of the mask which can be properly handled by the photoreduction process. Therefore, to increase the capacity of the chip, it is necessary to increase the storage density of the mask which is limited by the resolution of the photolithographic technique.

At present, bubble domain technology permits processing of a large number of memory chips on a relatively large garnet wafer with reasonable yield. However, when an improved method and design of a storage cell is provided, a large number of interconnected cells can be placed on a wafer. The size of the composite chip is not, per se, limited by the photoreduction technique limitations.

SUMMARY OF THE INVENTION

There is described a mass bubble memory system having large storage capacity. The basic storage cell design includes interconnection means whereby interfacing between basic cells can be achieved. The basic cell includes at least two storage loops and an appropriate number of alternative paths for bypassing any defective storage loop, along with input/output paths, detector, generator and other well known control devices. A plurality of the cells are placed on a garnet wafer in matrix form and the interconnection elements provide interconnection between the cells. By appropriately selecting the interconnection element, a tolerance to misalignment in cell positioning (due to the step/repeat process) permits the plurality of cells to interact appropriately. When the basic storage cells are connected and the appropriate storage or alternative paths are selected, a large-capacity, bubble memory is implemented.

DESCRIPTION OF THE DRAWINGS

FIG. 1 is a schematic representation of a wafer with a plurality of storage cells thereon.

FIG. 4 is a detailed showing of a suitable merge component.

FIG. 5 is a detailed showing of a suitable replicator component.

FIG. 6 is a detailed showing of a suitable junction component.

DESCRIPTION OF THE PREFERRED EMBODIMENT

Referring now to FIG. 1, there is shown a schematic representation (not to scale) of a memory system fabricated in accordance with the instant invention. In one embodiment, a suitable wafer 10 supports the memory element. Typical of such wafers is a garnet wafer although other materials may be utilized. Moreover, while present day wafers are on the order of 1.5 inches in diameter, it is expected that 2 or 3 inch diameter wafers (and perhaps larger) will become available in the future.

A memory unit 11 is produced on the surface of wafer 10. Memory 11 includes a plurality of individual cells A–J. (A detailed description of each cell is presented infra.) While nine cells A–J are shown, it is understood that the number of cells actually utilized is, ideally, limited only by the needs of the individual user as related to the characteristics and dimensions of the materials utilized. Of course, processing yield in any wafer will limit the extent of usefulness of a particular array.

In the particular memory shown and described, it is understood that a single mask is provided to define each individual cell. This mask is produced in accordance with suitable photoreduction processes. In one embodiment, the mask is approximately 0.25 inches square with a resolution of approximately 0.8μm. On a garnet wafer having a diameter of 2 inches, a 6 × 6 matrix with 36 separate cells has been produced.

The pattern produced by the mask is stepped and repeated, in matrix form, to produce the plurality of cells such as cells A–J. As will become apparent subsequently, by properly designing the cell with a sufficient tolerance, cells can be interconnected, serially, to increase the storage capacity of the memory. Furthermore, it is not essential (or necessary) to utilize every cell on the wafer. The matrix to be used may be 2 × 1, 2 × 2, or any other matrix array. This flexibility is permitted because of the modularity of the basic cell configuration, and the fact that each cell is designed to include all operational functions and to be self-sufficient. However, once the array is interconnected, as shown, only one set of control functions is required, per memory system.

Figure 2:
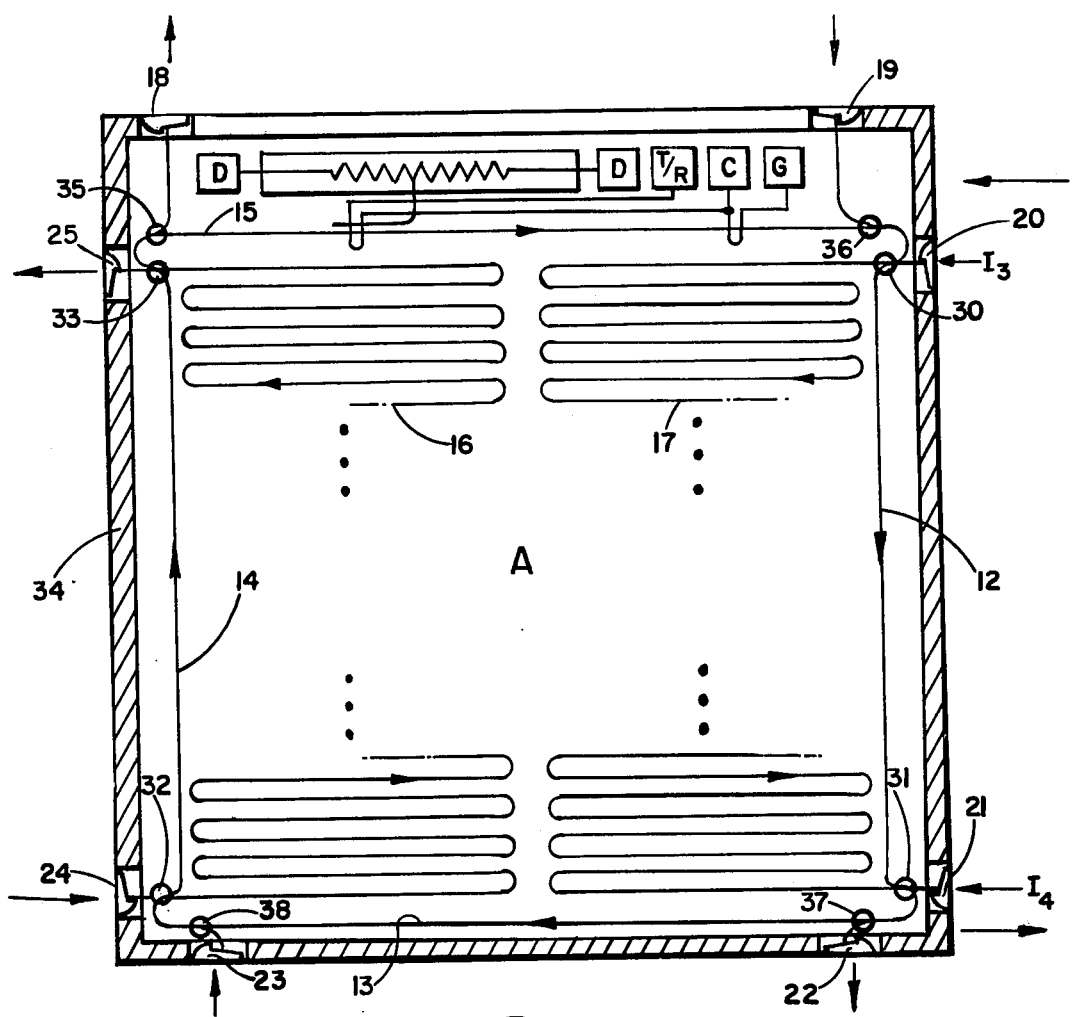
FIG. 2 is a more detailed showing of an individual storage cell shown in FIG. 1.

Referring now to FIG. 2, there is shown an enlarged, more detailed version of cell A which is formed on wafer 10 of FIG. 1. It should be understood, of course, that the description of cell A is equally appropriate to each of the cells A-J shown in FIG. 1 inasmuch as each of the cells is processed using the same mask.

Cell A defines a plurality of storage loops 16 and 17 which are formed in any suitable fashion known in the art. For example, the storage loops may comprise elongated propagation paths fabricated using chevrons, T-Bars, I-bars or the like along with appropriate corners and any other bubble domain devices which may be required. In some embodiments, loops 16 and 17 may have different lengths in order to facilitate testing procedures.

A pair of bypass propagation paths 12 and 14 are connected, operationally, in parallel with storage loops 17 and 16, respectively. That is, bypass path 12 is connected between the ends of storage loop 17 while bypass path 14 is connected between the ends of storage loop 16. In addition, bypass paths 13 and 15 provide series connections between ends of storage loops 16 and 17. In particular, bypass path 13 interconnects the output end of storage loop 17 and the input end of storage loop 16. Conversely, bypass path 15 interconnects the output end of storage loop 16 with the input end of storage loop 17.

This interconnection between the respective storage loops, bypass paths and interconnection elements is accomplished by means of a junction element. In particular, junction element 30 interconnects the input ends of storage loop 17 and bypass path 12 to the output ends of bypass path 15 and interconnection element 20. (See FIG. 6 for more detail.) Likewise, junction element 31 interconnects the output ends of storage loop 17 and bypass path 12 with the input end of interconnection element 21 and the input end of bypass path 13. The connection of junction elements 32 and 33 relative to storage loop 16, bypass paths 13, 14 and 15, and interconnection elements 24 and 25 is readily discernible. Thus, it is seen that junction elements 30-33 effectively provide merge and transfer/replicate functions.

Guardrail 34 substantially surrounds the outer perimeter of the storage cell A. However, appropriate breaks are provided in the guardrail to permit insertion of interconnect elements 18-25, inclusive. Interconnect elements 18 and 19 are connected to bypass path 15 via replicate and merge elements 35 and 36, respectively. Likewise, interconnect elements 22 and 23 are connected to bypass path 13 via replicate and merge elements 37 and 38, respectively.

Also provided on each storage cell are appropriate control signals such as generator control signal, transfer/replicate control signal, detector signals and the like. These signals are applied via suitable terminal pads which are shown in FIG. 2. Inasmuch as the operation of these signals and the related devices is known in the art, a detailed description and analysis thereof is not presented herewith. It is believed sufficient to comment that signals can be generated in the propagation paths of cell A and transferred or replicated through to the detector section and the like as may be necessary or desirable.

The invention is directed primarily toward increased storage capability of the memory. As is readily discernible, storage loops 16 and/or 17 are continuous paths which include many loops wherein substantial amounts of information may be stored. (All of the loops or lines are not shown. However, each of loops 16 and 17 are intended to be complete, continuous paths.) Clearly, if a plurality of loops 16 or 17 are connected in series, a significant storage capacity can be obtained. Therefore, it is desirable to interconnect a plurality of cells, such as cell A, in a manner as suggested in FIG. 1.

The interconnections between the several cells are made through at least some of the interconnection elements 18-25, depending upon the location of the individual cell and the like.

It is well known, in fabricating bubble domain devices that all too frequently a chip with a defective portion thereof is produced. For example, it is possible that storage loop 16 or 17 or both may be defective in any particular cell. By concurrent reference to FIG. 1, a matrix comprising a plurality of cells similar to cell A is shown. In the cells shown in FIG. 1, cell A is defined as having a defective loop 17 as is the case for cells F and G. Cells B and D are depicted as having defective loops 16. Cell J is shown as having defects in both of the loops 16 and 17. On the other hand, cells C, E and H are shown to be defect-free cells. These cell defects are detected by means of any suitable testing (probe) technique.

Inasmuch as these cells are interconnected via the appropriate interconnection elements 18-25 in respective cells and, as described infra, appropriate structural arrangements are made internally of each cell, the defect-free portions thereof are incorporated into the memory and the defective portions thereof are bypassed.

By the appropriate interconnections and structural arrangements of the cells formed in the memory unit shown in FIG. 1, the memory cell 11 on wafer 10 is retained as a useful device. Without the arrangement as defined by this invention, the defects in cells A, B, D, F, G and J would render the chip unusable and the entire chip and wafer would be discarded as defective.

Figure 3:
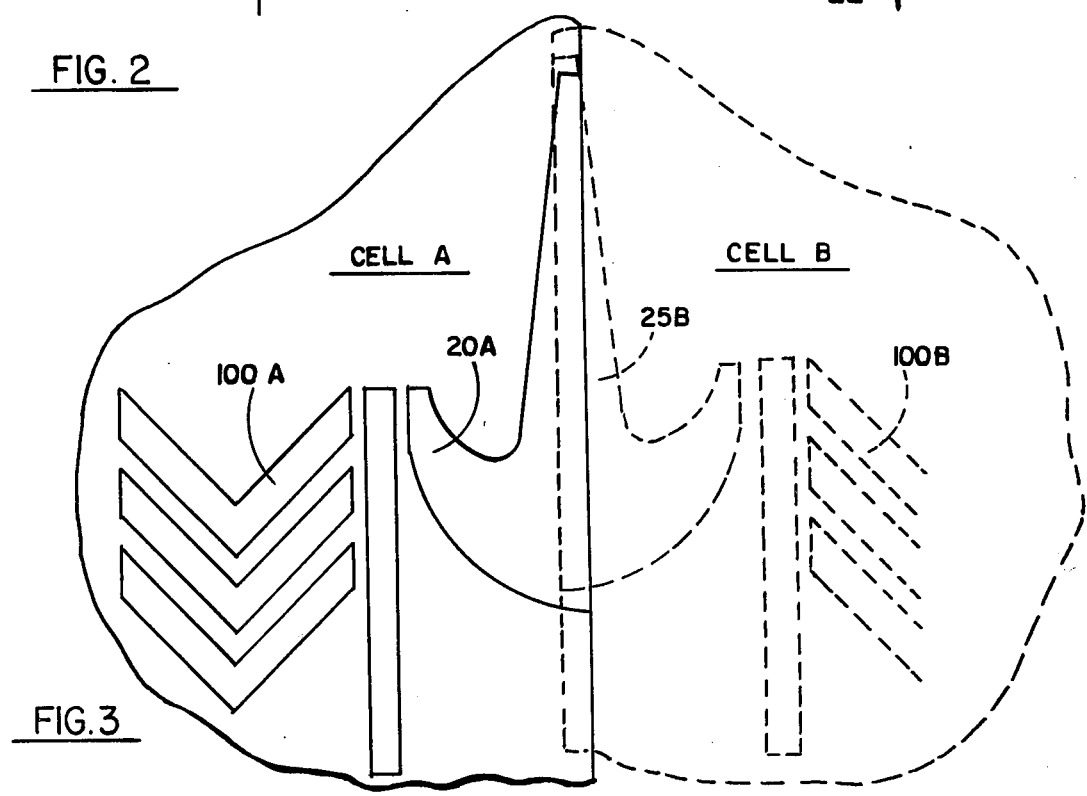
FIG. 3 is a more detailed showing of interconnection elements of abutted cells.

Referring now to FIG. 3, there is shown an interconnection element as contemplated by the instant invention. In FIG. 3, the interconnect elements of a pair of cells, for example cells A and B, are shown in interconnecting relationship. In particular, interconnection elements 20A and 25B are shown to overlap and be offset relative to each other. That is, the edge of cell A is shown to overlap the edge of cell B. This overlap can be caused when the mask for the cell is repeatedly positioned relative to wafer 10. As is noted supra, with the photolithographic processes resolution errors can occur. Such an error is suggested in FIG. 3. In an ideal situation, the edges of the cells would be in complete alignment. Likewise, the edges of the interconnect elements would also be in alignment. However, as can be seen from the arrangement shown in FIG. 3, the propagation path defined by interconnection elements 20A and 25B of adjacent cells provides sufficient continuity wherein a bubble can be transferred in the garnet wafer even though the resolution of the masking processes is skewed. Without the relatively large transfer of interconnection device or element the resolution requirements between the respective cells would be virtually impossible to achieve. With this interconnection element, signals propagating along path 100A are propagated through to propagation path 100B via interconnect elements 20A and 25B which overlap.

While the overlap shown in FIG. 3 is considered to be a rather severe condition, it is possible that the interconnection elements may be aligned along the elongated edges and be misaligned at the respective ends thereof. Conversely, the misalignment may occur in the form of skewing of the elements. However, so long as there is some overlap, of the elements, the interconnection function will be achieved. Of course, if the resolution error is of such a nature that interconnection elements 20A and 25B are physically spaced apart by a sufficient distance wherein magnetic fields or poles will not cause bubbles (i.e., bubble strip) to span this gap, a suitable propagation path is not provided.

The interconnection path herein described has a relatively elongated bar-like member with an intersecting second bar or leg which is, generally, somewhat shorter than the first mentioned bar. Each of the bars tapers into a wider section near the junction thereof. Consequently, the interconnection element is referred to as a "fat-T" or a "fish-hook" device. The longer bar of the interconnection element is used as the interface section along the edge of the storage cell. Thus, greater resolution tolerance is achievable in order to provide an interconnection between the cells. The shorter bar of the element projects toward the propagation path and selectively establishes a magnetic pole thereat in order to receive bubbles from the propagation path. Because of the configuration of this element, especially the long center bar element, the bubbles generally assume a strip form.

Referring now to FIG. 4, there is shown a suitable merge component 75 such as any of the merge devices or elements shown in FIGS. 1 and 2. The merge components comprise a plurality (two shown) of input paths and a single output path.

Referring now to FIG. 5, there is shown a suitable replicator component which may be utilized in the circuits shown in FIGS. 1 or 2. Again, the replicator may be used to perform the replicate function as described and is known in the art. The replicator typically includes a single input path and a plurality (two shown) of output paths.

It should be understood that a junction element (see FIG. 6) may be provided by combining a merge component (FIG. 4) with a replicator component (FIG. 5). In particular, the single output path of the merge component is completed with the single input path of the replicator component in order to provide a junction element.

Referring concurrently to FIGS. 4 and 5, there are shown dashed outlines 50–53 which enclose portions of the respective components. The outlined portions are selectively removed, as for example by etching, from the individual storage cells as a function of the condition of the cell. That is, as noted supra, after a memory has been prepared by means of producing a plurality of cells, it is tested to find which storage loops (if any) are defective. When defective loops are identified, the loops are then removed from the circuit. For example, referring concurrently to FIGS. 2, 4 and 5, consider that loop 17 is defective while loop 16 is defect-free. Under these conditions, the replicator component portion of junction element 30 would be etched so that the output line connected to storage loop 17 is removed. Consequently, the output line connected to bypass path 12 remains intact. Conversely, the merge portion of junction element 31 would be etched so that the input line connected to storage loop 17 is removed. Consequently, bypass path 13 as well as interconnection element 21 are connected to bypass paths 12. Thus, defective loop 17 is removed from the system and is inoperative while information from the system is propagated along bypass path 12.

Furthermore, it is now necessary to determine status of the adjacent cells. For example, in cell A the left and upper sides are not connected or to be interconnected to additional cells. Consequently, the merge portion of junction element 32 is etched to remove the input line connected to interconnection element 24. Likewise, the replicate component of junction element 32 is etched to remove the output line connected to bypass path 14.

Referring to junction element 33, the etching process removes the input line from a bypass path 14 which is connected to an input of the merge portion. In addition, in the replicator portion of junction element 33, the output line connected to interconnect element 25 is removed. Also, the output line of replicator 35 which is connected to interconnection element 18 is removed as is the input line from interconnection element 19 at merge component 36. Consequently, information will circulate through storage loop 16 via bypass path 15 to bypass path 12. Similar operations will be made on the junction, merge, or replicate components associated with interconnect elements 20, 21, 22 and 23 to provide an appropriate means for transferring bubbles in the appropriate path.

The appropriate action to be taken with respective components in order to form the storage path suggested in FIG. 1 is believed to be self-evident and a detailed analysis thereof would be repetitious at this point.

Referring now to FIG. 6, there is shown a schematic representation of a junction element such as junction elements 30–33. In particular, FIG. 6 shows a schematic representation of junction element 30. Junction element 30 includes a merge component such as merge 75 (see FIG. 4) and a replicator component 76 (see FIG. 5). The output ends of propagation paths 15 and 20 are merged together at merge 75. The output of merge 75 becomes the input to replicator 76. The input ends of paths 17 and 12 represent the outputs such as output 1 and 2 of replicator 76. It should be understood, of course, that junction elements 31–33 are substantially similar although the direction of bubble propagation may be reversed and different propagation paths are involved. Nevertheless, in each junction element a merge component is connected to supply signals to a replicator component wherein signals of bubbles propagated from the output ends of propagation paths are supplied to the input ends of other propagation paths.

Thus, there has been shown and described a composite chip concept wherein magnetically interconnected storage cells form a single serial loop on a chip, the capacity of the chip is maximized by providing redundant loops which can be utilized to overcome defective loops. By proper interconnection of the defect-free portions of the various chips or cells which are provided on a wafer or the like, a large capacity bubble domain memory can be achieved. By using the method and apparatus described herein, greater yield on processed wafers can be achieved.

To those skilled in the art, certain modifications to the instant invention may become apparent. For example, a one dimensional composite chip may be desired. Such a chip can be achieved by interconnecting a row or a column of the matrix shown in FIG. 1. Any such row or column configuration can be achieved so long as interconnect elements are made available to the adjoining cells.

In addition, it should be understood that certain bubble domain devices and structures are shown and described. Other devices or structures which fulfill the requirements of the invention can be utilized. Any modifications in the system or utilization of different component devices or structures is intended to be included within the purview of this description.

Having thus described a preferred embodiment of the invention what is claimed is:

1. A large capacity memory comprising:
   a plurality of substantially similar modules arranged in an array,
   interconnecting means in each module for interconnecting the adjacent modules in said array,
   said interconnecting means having sufficient size to permit reasonable tolerance in alignment thereof while permitting actual interconnection of the adjacent modules,
   each of said modules including a plurality of propagation paths arranged substantially in parallel to each other in a functional manner,
   passive junction means connected to the ends of certain propagation paths and to said interconnecting means,
   said junction means is selectively alterable to establish the connection between respective paths in said module whereby the propagation paths in all of said modules are connected together in series.

2. The memory recited in claim 1 wherein
   said modules are formed in a magnetic bubble domain material so that said memory stores information in the form of magnetic bubble domains.

3. The memory recited in claim 2 wherein said propagation paths are formed of suitable magnetic bubble domain device components such that magnetic bubble domains propagate therealong under the influence of magnetic fields,
   said propagation paths include at least one elongated path for storing information therein, and
   at least one shorter path which is arranged relative to said elongated path to establish a functionally parallel path,
   said junction means connected to the ends of said elongated path and said shorter path.

4. The memory recited in claim 3 including
   a second elongated path for storing information therein,
   a second shorter path which is arranged relative to said second elongated path to establish a functionally parallel path,
   a first bypass path selectively connected between one end of each of said elongated paths at one of said junction means, and
   a second bypass path selectively connected between another end of each of said elongated paths at one of said junction means.

5. The memory recited in claim 4 including
   further interconnecting means connected to said first and second bypass paths,
   all of said interconnecting means formed of one half of a fat-T type element whereby a fat-T element is effectively formed at each interconnection when a pair of modules is interconnected.

6. The memory recited in claim 1 wherein
   each module includes control functions for generating and detecting magnetic bubble domains in the memory.

7. The memory recited in claim 1 wherein
   said interconnecting means are disposed at the edges of each of said modules.

8. The memory recited in claim 1 wherein
   said junction means comprises merge means and replicate means connected in series with each other.

9. The memory recited in claim 8 wherein
   said junction means is selectively alterable by removing portions of said merge means and said replicate means so that certain of said propagation paths are permanently connected in series and others of said propagation paths are permanently disconnected.

10. A method of forming a large capacity magnetic bubble domain memory comprising the steps of
    forming a plurality of substantially similar modules, as recited in claim 1, on a wafer of magnetic bubble domain material,
    testing the integrity of the propagation paths in each module,
    masking and etching portions of said junction means so that the longest propagation paths exhibiting integrity are connected together in series and the other propagation paths are disconnected.

11. The method recited in claim 10 wherein the plurality of substantially similar modules is formed by establishing a suitable module mask and, using a step and repeat process, reiterating the module on said wafer with said modules in abutting or overlapping relation.

* * * * *

UNITED STATES PATENT AND TRADEMARK OFFICE
CERTIFICATE OF CORRECTION

PATENT NO. : 4,075,709
DATED : December 21, 1978
INVENTOR(S) : T. T. Chen et al

It is certified that error appears in the above-identified patent and that said Letters Patent are hereby corrected as shown below:

On the title page, at [45] Issue Date, change [December 21, 1978] to read --February 21, 1978--.

Signed and Sealed this

Thirteenth Day of October 1981

[SEAL]

Attest:

Attesting Officer

GERALD J. MOSSINGHOFF

Commissioner of Patents and Trademarks